(12) United States Patent
Inoue et al.

(10) Patent No.: US 8,390,257 B2
(45) Date of Patent: Mar. 5, 2013

(54) BATTERY CAPACITY CONTROLLER

(75) Inventors: Katsuya Inoue, Saitama (JP);
Yoshikazu Ohnuma, Saitama (JP); Yuji Fujita, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 432 days.

(21) Appl. No.: 12/543,192

(22) Filed: Aug. 18, 2009

(65) Prior Publication Data

US 2010/0052618 A1     Mar. 4, 2010

(30) Foreign Application Priority Data

Aug. 26, 2008     (JP) ................................. 2008-217249

(51) Int. Cl.
*H02J 7/00* (2006.01)

(52) U.S. Cl. ........................................................ 320/132

(58) Field of Classification Search .................... 320/132
See application file for complete search history.

(56) References Cited

U.S. PATENT DOCUMENTS

| | | | |
|---|---|---|---|
| 5,949,217 A | 9/1999 | Okada et al. | |
| 6,522,148 B2 | 2/2003 | Ochiai et al. | |
| 6,841,972 B2* | 1/2005 | Koo | 320/132 |
| 7,202,632 B2 | 4/2007 | Namba | |
| 7,321,220 B2* | 1/2008 | Plett | 320/128 |
| 7,570,024 B2* | 8/2009 | Melichar | 320/149 |
| 7,688,075 B2* | 3/2010 | Kelley et al. | 324/426 |
| 8,054,045 B2* | 11/2011 | Kawahara et al. | 320/127 |

FOREIGN PATENT DOCUMENTS

| | | |
|---|---|---|
| JP | 11-174134 A | 7/1999 |
| JP | 11346444 A | 12/1999 |
| JP | 2002286820 A | 10/2002 |
| JP | 2002328154 A | 11/2002 |
| JP | 3454657 B2 | 10/2003 |
| JP | 3752879 B2 | 3/2006 |
| JP | 3767150 B2 | 4/2006 |
| JP | 2006215001 A | 8/2006 |
| JP | 3864590 B2 | 1/2007 |

OTHER PUBLICATIONS

Japanese Office Action, issued Jun. 8, 2010 for corresponding Japanese Patent Application No. 2008-217249.

* cited by examiner

*Primary Examiner* — Ramy Ramadan
(74) *Attorney, Agent, or Firm* — Westerman, Hattori, Daniels & Adrian, LLP

(57) ABSTRACT

A battery capacity controller includes a battery capacity estimating part that estimates the battery capacity of a battery in which an internal resistance is increased in accordance with the decrease of the battery capacity in the vicinity of a prescribed lower limit battery capacity and a battery capacity correcting part that changes, during the discharge of the battery, an estimated battery capacity estimated by the battery capacity estimating part to a proper value in a lower limit side when an internal resistance difference as a difference between the internal resistance value of the battery and the internal resistance value of the battery at the time of the lower limit battery capacity is a prescribed value or lower.

16 Claims, 15 Drawing Sheets

FIRST STAGE

LAST STAGE

BATTERY CAPACITY CONTROLLER

CROSS-REFERENCE TO RELATED APPLICATIONS

This application is based on and claims priority under 35 U.S.C. 119 from Japanese Patent Application No. 2008-217249 filed on Aug. 26, 2008.

BACKGROUND OF THE INVENTION

1. Technical Field

The present invention relates to a battery capacity controller that corrects a battery capacity or a storage capacity of a battery obtained by a calculation.

2. Related Art

On a vehicle such as an EV (Electric Vehicle) or an HEV (Hybrid Electrical Vehicle), a battery is mounted that supplies an electric power to an electric motor. In the battery, a plurality of battery cells connected in series are provided. As the battery cell, a secondary cell such as a nickel hydrogen cell or a lithium ion is used. In this case, in order to use the secondary cell safely, a residual capacity (SOC:State of Charge) of each battery cell needs to be constantly monitored to prevent an overcharge or an over-discharge.

As one of methods for detecting the SOC of the battery cell, a method has been known in which the SOC is calculated on the basis of the integration of a current. In this method, the charging current and the discharging current of the battery cell are integrated at intervals of prescribed periods to calculate a quantity of integrated charging current and a quantity of integrated discharging current and the quantity of integrated charging current and the quantity of integrated discharging current is added to or subtracted from the SOC of an initial state or the SOC immediately before the start of charging and discharging operations to obtain the SOC of the battery cell. The SOC calculated by this method is referred to as an "integrated SOC", hereinafter.

An accuracy of the integrated SOC obtained by the above-described method is high. However, since, in the battery mounted on the vehicle, charging and discharging operations are repeated within a prescribed width of the SOC of the battery cell and the battery cell is used for a long period, errors are accumulated in the integrated SOC. Further, when the quantity of integrated charging current the quantity of integrated discharging current are calculated, for instance, measurement errors of a current detector may be occasionally accumulated to increase the error of the integrated SOC. Further, since the decrease of the capacity due to a self-discharge occurring while the vehicle is left for a long period is not integrated, this also results in a factor of the error.

As another method for detecting the SOC of the battery cell, there is a method for detecting the SOC on the basis of a terminal voltage of the battery cell during the charging and discharging operations. A prescribed relation exists between the SOC of the battery cell and an open circuit voltage (OCV) and one example thereof is shown in FIG. 11. An upper limit SOC and a lower limit SOC in FIG. 11 show an upper end value and a lower end value within a prescribed range of the SOC where the charging and discharging operations of the battery cell are repeated. In the battery cell having a property shown in FIG. 11, the change of the OCV is large in the upper limit SOC and the lower limit SOC, however, in a range between the upper limit SOC and the lower limit SOC, the change of the OCV is very small.

Accordingly, when the SOC of the battery cell having the property shown in FIG. 11 is calculated in accordance with the terminal voltage, the upper limit SOC and the lower limit SOC can be accurately obtained, however, the SOC ranging from the upper limit SOC to the lower limit SOC cannot be accurately obtained. Further, as described above, since in the battery mounted on the vehicle, the charging and discharging operations are repeated within the prescribed width of the SOC of the battery cell, the influence of a diffusion resistance is large and the OCV property of the battery cell is greatly changed. As described above, the accuracy of the SOC calculated on the basis f the terminal voltage is frequently low.

The above-described two methods respectively have advantages and disadvantages. However, when the disadvantages are respectively compensated for each other, an accurate SOC is supposed to be obtained. A residual capacity detector disclosed in patent literature 1 replaces data of an integrated residual capacity by a prescribed upper limit value in accordance with the terminal voltage of a battery device and carries out a correcting process so that a difference between an integrated residual capacity calculated after the replacement of the data and a corrected residual capacity obtained by correcting the integrated residual capacity is increased in accordance with the increase of the integrated value of charging and discharging currents. Accordingly, for instance, even when a deviation between the integrated residual capacity and an actual residual capacity is increased in accordance with the increase of the integrated value of the charging and discharging currents, the accuracy of an approximation of the corrected residual capacity to the actual residual capacity can be improved.

[Patent literature 1] JP-A-2002-328154
[Patent literature 2] JP-A-2002-286820
[Patent literature 3] JP-A-2006-215001
[Patent literature 4] JP-A-11-346444
[Patent literature 5] Japanese Patent No. 3864590
[Patent literature 6] Japanese Patent No. 3752879
[Patent literature 7] Japanese Patent No. 3454657
[Patent literature 8] Japanese Patent No. 3767150

When a detecting accuracy of the SOC of the battery is not good, after the charging and discharging operations of the battery, a state may possibly occur that the SOC deviates from a range of the SOC where the battery can be used. For instance, even when the actual SOC is lower than the lower limit SOC, the above-described state may possibly occur. Such an undesirable state may possibly shorten the life of the battery or affect the control of the electric motor using the battery. The above-described possibility is low in the first stage that the use of the battery is started, however, is high in the last stage that the battery is used for a long time to come near to an end of its span of life.

Accordingly, particularly in the last stage of the battery, a good detecting accuracy of the SOC is required. As described above, the integrated SOC calculated on the basis of the integration of the current has a high accuracy, however, includes an error. Further, in the SOC calculated on the basis of the terminal voltage, since the change of the OCV is large in the vicinity of the upper limit SOC and the lower limit SOC, the accuracy is high. However, in the range between the upper limit SOC and the lower limit SOC, since the change of the OCV is small, the accuracy is low. Accordingly, a method is supposed to be used in which the SOC of the battery is ordinarily managed in accordance with the integrated SOC calculated on the basis of the integration of the current, however, when an actual SOC comes near to the upper limit SOC or the lower limit SOC, the SOC is corrected by an SOC calculated on the basis of the terminal voltage.

FIGS. 12A and 12B show the ranges of a control SOC and an actual SOC of the battery in the first stage (FIG. 12A) and the last stage (FIG. 12B). Further, FIGS. 13A and 13B show graphs illustrating a transition of the decreasing control SOC of the battery in the first stage (FIG. 13A) and the last stage (FIG. 13B). Further, FIG. 14 is a diagram showing the output change of the battery that is changed by the control of the decreasing control SOC in the battery of the last stage. The control SOC indicates an SOC of the battery that is recognized by an ECU for managing the state of the battery. In examples shown in FIGS. 12 and 13, the battery is used when the control SOC is located between 20% and 80%. Further, the actual SOC indicates an actual SOC of the battery at that time.

As shown in FIGS. 12A and 13A, in the case of the battery of the first stage, even when the ECU decides that the control SOC is lowered to, for instance, 28% due to a discharging operation for supplying an electric power to an electric motor, the actual SOC is not lowered to 28%. Therefore, although the discharging operation is continuously carried out, the ECU maintains the control SOC to 28% as it is, and then, when the SOC calculated on the basis of the terminal voltage reaches 20%, the ECU corrects the control SOC to 20%.

On the other hand, as shown in FIGS. 12B and 13B, the capacity of the battery of the last stage is decreased more than the capacity of the battery of the first stage. Accordingly, in the case of the battery of the last stage, when the ECU decides that the control SOC is lowered to, for instance, 53%, the actual SOC is lowered to 20%. Therefore, the ECU corrects the control SOC from 53% to 20% in accordance with the SOC (20%) calculated on the basis of the terminal voltage. As a result, as shown in FIG. 14, the output of the battery is greatly lowered.

Now, a case will be described in which the control SOC of the battery is increased. FIGS. 15A and 15B show the ranges of the control SOC and the actual SOC of the battery in the first stage (FIG. 15A) and the last stage (FIG. 15B). Further, FIGS. 16A and 16B show graphs illustrating a transition of the increasing control SOC of the battery in the first stage (FIG. 16A) and the last stage (FIG. 16B). Further, FIG. 17 is a diagram showing the output change of the battery that is changed by the control of the increasing control SOC in the battery of the last stage.

As shown in FIGS. 15A and 16A, in the case of the battery of the first stage, even when the ECU decides that the control SOC is increased to, for instance, 72% due to a charging operation of the battery, the actual SOC is not increased to 72%. Therefore, although the charging operation is continuously carried out, the ECU maintains the control SOC to 72% as it is, and then, when the SOC calculated on the basis of the terminal voltage reaches 80%, the ECU corrects the control SOC to 80%.

On the other hand, as shown in FIGS. 15B and 16B, the capacity of the battery of the last stage is decreased more than the capacity of the battery of the first stage. Accordingly, in the case of the battery of the last stage, when the ECU decides that the control SOC is increased to, for instance, 47%, the actual SOC is increased to 80%. Therefore, the ECU corrects the control SOC from 47% to 80% in accordance with the SOC (80%) calculated on the basis of the terminal voltage. As a result, as shown in FIG. 17, the output of the battery is greatly lowered.

An output torque of the electric motor as a driving source of the vehicle such as the EV or the HEV is controlled in accordance with the SOC of the battery, because an output is different depending on the SOC of the battery as shown in FIGS. 14 and 17. Accordingly, an impression of a driver about the traveling performance of the vehicle may possibly depend on an influence given to the electric motor in accordance with the SOC of the battery. For instance, during the cruising travel of the vehicle, the driver slightly steps on an accelerator and an assist force by the electric motor in the HEV is low. At this time, even when the control SOC is corrected by the SOC calculated on the basis of the terminal voltage, an influence given to the assist force by the electric motor is low.

However, at the time of acceleration or climbing a slope, the driver strongly steps on the accelerator and the assist force by the electric motor in the HEV is high. At this time, when the control SOC is corrected and, for instance, the control SOC is abruptly lowered as shown in FIG. 14, the electric power supplied to the electric motor from the battery is abruptly decreased to lower the output torque of the electric motor. Accordingly, although the driver steps on the accelerator, a desired torque is not outputted or the torque is abruptly changed. Thus, the driver has an uneasy feeling for the traveling performance.

When the battery continuously supplies the electric power to the electric motor not to give such an uneasy feeling to the driver, though the actual SOC of the battery is the lower limit SOC or lower, the battery needs to continuously output to the electric motor the electric power not lower than the performance of the battery. Such a control undesirably causes the life of the battery to be shortened or an adverse effect to be given to the durability of the battery.

SUMMARY OF THE INVENTION

It is an object of the present invention to provide a battery capacity controller that highly accurately detects the battery capacity of a battery and does not give an uneasy feeling for a traveling performance to a driver.

In order to solve the above-described problems and achieve the above-described object, according to the first aspect of the invention, there is provided a battery capacity controller including:

a battery capacity estimating part (for instance, a residual capacity estimating part 111 in an embodiment) that estimates the battery capacity of a battery (for example, a battery 103 in the embodiment) in which an internal resistance is increased in accordance with the decrease of the battery capacity (for instance, a residual capacity (SOC) in the embodiment) in the vicinity of a prescribed lower limit battery capacity (for instance, a lower limit SOC in the embodiment); and a battery capacity correcting part (for instance, a control part 121 in the embodiment) that changes, during the discharge of the battery, an estimated battery capacity estimated by the battery capacity estimating part to a proper value in a lower limit side, when an internal resistance difference as a difference between the internal resistance value of the battery and the internal resistance value of the battery at the time of the lower limit battery capacity is a prescribed value or lower.

Further, according to the second aspect of the invention, there is provided the battery capacity controller defined in the first aspect, further including:

a current detecting part (for instance, a current detecting part 105 in the embodiment) that detects a charging and discharging current of the battery;

a voltage detecting part (for instance, a voltage detecting part 107 in the embodiment) that detects a terminal voltage of the battery; and a storing part (for instance, a storing part 119 in the embodiment) that stores the terminal voltage when the battery capacity of the battery is the lower limit battery capacity, wherein the battery capacity correcting part divides a difference between the terminal voltage of the battery detected by the voltage detecting part and the terminal voltage of the battery during the lower limit battery capacity by the value of a discharging current of the battery detected by the current detecting part to calculate the internal resistance difference.

Further, according to the third aspect of the invention, there is provided the battery capacity controller defined in the first or second aspect, further including:

a charging and discharging control part (for instance, the control part 121 in the embodiment) that controls the charging and discharging operations of the battery in accordance with the estimated battery capacity, wherein the charging and discharging control part starts the charging operation of the battery, when the battery capacity correcting part changes the estimated battery capacity to the proper value in the lower limit side.

Further, according to the forth aspect of the invention, there is provided the battery capacity controller defined in anyone of the first to third aspects, wherein the proper value in the lower limit side is a value lower than the estimated battery capacity, and a battery capacity value that can output the same continuous output electric power as a continuous output electric power of the battery corresponding to the estimated battery capacity when the internal resistance difference is the prescribed value.

Further, according to the fifth aspect, there is provided a battery capacity controller including:

a battery capacity estimating part (for instance, a residual capacity estimating part 111 in the embodiment) that estimates the battery capacity of a battery in which an internal resistance is increased in accordance with the increase of the battery capacity (for instance, a residual capacity (SOC) in the embodiment) in the vicinity of a prescribed upper limit battery capacity (for instance, an upper limit SOC in the embodiment); and a battery capacity correcting part (for instance, a control part 121 in the embodiment) that changes, during the charging of the battery, an estimated battery capacity estimated by the battery capacity estimating part to a proper value in an upper limit side, when an internal resistance difference as a difference between the internal resistance value of the battery and the internal resistance value of the battery at the time of the upper limit battery capacity is a prescribed value or lower.

Further, according to the sixth aspect of the invention, there is provided the battery capacity controller defined in the fifth aspect, further including:

a current detecting part (for instance, a current detecting part 105 in the embodiment) that detects a charging and discharging current of the battery;

a voltage detecting part (for instance, a voltage detecting part 107 in the embodiment) that detects the terminal voltage of the battery; and a storing part (for instance, a storing part 119 in the embodiment) that stores the terminal voltage when the battery capacity of the battery is the upper limit battery capacity, wherein the battery capacity correcting part divides a difference between the terminal voltage of the battery detected by the voltage detecting part and the terminal voltage of the battery during the upper limit battery capacity by the value of the charging current of the battery detected by the current detecting part to calculate the internal resistance difference.

Further, according to the seventh aspect of the invention, there is provided the battery capacity controller defined in the fifth or sixth aspect, further including:

a charging and discharging control part (for instance, a control part 121 in the embodiment) that controls the charging and discharging operations of the battery in accordance with the estimated battery capacity, wherein the charging and discharging control part starts the discharging operation of the battery, when the battery capacity correcting part changes the estimated battery capacity to the proper value in the upper limit side.

Further, according to the eighth aspect of the invention, there is provided the battery capacity controller defined in any one of the fifth to seventh aspects, wherein the proper value in the upper limit side is a value higher than the estimated battery capacity, and a battery capacity value that can output the same continuous output electric power as a continuous output electric power of the battery corresponding to the estimated battery capacity when the internal resistance difference is the prescribed value.

Further, according to the ninth aspect of the invention, there is provided the battery capacity controller defined in any one of the first to eighth aspects, wherein the battery provided in a vehicle on which an electric motor is mounted as a driving source supplies an electric power to the electric motor, the battery capacity controller includes a traveling resistance estimating part (for instance, a traveling state detecting part 117 in the embodiment) that estimates the traveling resistance of the vehicle, and the battery capacity correcting part operates when the traveling resistance estimated by the traveling resistance estimating part is a prescribed value or higher.

Further, according to the tenth aspect of the invention, there is provided the battery capacity controller defined in any one of the first to forth and ninth aspects, wherein the battery provided in the vehicle on which the electric motor is mounted as the driving source supplies the electric power to the electric motor, and the battery capacity correcting part operates when the vehicle travels to climb a slope.

Further, according to the eleventh aspect of the invention, there is provided the battery capacity controller defined in any one of the fifth to ninth aspects, wherein the battery provided in the vehicle on which the electric motor is mounted as the driving source supplies the electric power to the electric motor, and the battery capacity correcting part operates when the vehicle travels to cruise.

Further, according to the twelfth aspect of the invention, there is provided the battery capacity controller defined in the first to eleventh aspects, wherein the battery capacity correcting part operates when the charging and discharging current of the battery is located within a range of a prescribed value.

Further, according to the thirteenth aspect of the invention, there is provided the battery capacity controller defined in any one of the first to twelfth aspects, wherein the battery capacity estimating part estimates the battery capacity of the battery on the basis of the integration of the charging and discharging current of the battery.

According to the battery capacity controller of the present invention defined in the first and second aspects, since the estimated battery capacity is changed to the proper value in the lower limit side in accordance with the internal resistance difference before the battery capacity of the battery reaches the lower limit battery capacity, the battery capacity of the battery can be highly accurately detected. Further, there is a low possibility that an adverse influence is given to the durability of the battery.

According to the battery capacity controller of the present invention defined in the third and fourth aspects, the continuous output voltage of the battery corresponding to the estimated battery capacity changed to the lower limit battery capacity is the same as the continuous output voltage before the change of the estimated battery capacity, and the charging operation is started after the change of the estimated battery capacity. Therefore, the battery can supply the same continuous output voltage as that before the change of the estimated battery capacity. As a result, the driver of a vehicle on which an electric motor driven by the voltage from the battery is mounted as a driving source can drive the vehicle without having an uneasy feeling for a traveling performance even when the estimated battery capacity is changed to the proper value in the lower limit side during a driving operation.

According to the battery capacity controller of the present invention defined in the fifth and sixth aspects, since the estimated battery capacity is changed to the proper value in the upper limit side in accordance with the internal resistance difference before the battery capacity of the battery reaches the upper limit battery capacity, the battery capacity of the battery can be highly accurately detected. Further, there is a low possibility that an adverse influence is given to the durability of the battery.

According to the battery capacity controller of the present invention defined in the seventh and eighth aspects, the continuous output voltage of the battery corresponding to the estimated battery capacity changed to the upper limit battery capacity is the same as the continuous output voltage before the change of the estimated battery capacity, and the discharging operation is started after the change of the estimated battery capacity. Therefore, the battery can supply the same continuous output voltage as that before the change of the estimated battery capacity. As a result, the driver of a vehicle on which an electric motor driven by the voltage from the battery is mounted as a driving source can drive the vehicle without having an uneasy feeling for a traveling performance even when the estimated battery capacity is changed to the proper value in the upper limit side during a driving operation.

According to the battery capacity controller of the present invention defined in the ninth, tenth and eleventh aspects, even when the estimated battery capacity is changed to the proper value in the lower limit side or the proper value in the upper limit side at the time of climbing a slope in which the traveling resistance of the vehicle is high or at the time of a cruising travel, the driver can drive the vehicle without having an uneasy feeling for the traveling performance.

According to the battery capacity controller of the present invention defined in the twelfth aspect, the battery capacity correcting part can precisely calculate the internal resistance difference.

According to the battery capacity controller of the present invention defined in the thirteenth aspect, the battery capacity estimating part can highly accurately estimate the battery capacity of the battery.

DETAILED DESCRIPTION OF THE PREFERRED EMBODIMENTS

Figure 1:
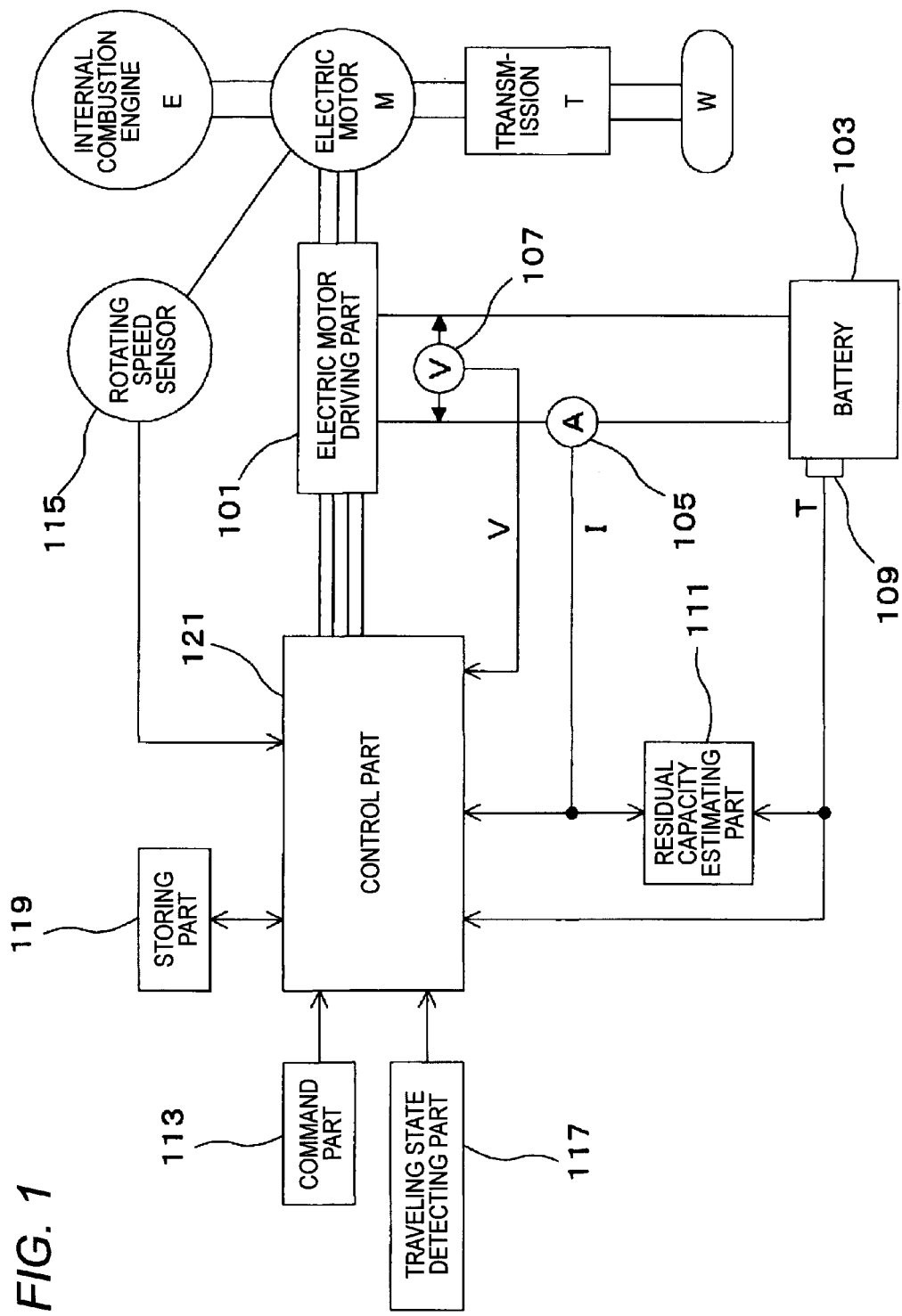
FIG. 1 is a block diagram showing an inner structure of a vehicle including a battery capacity controller of one embodiment according to the present invention.

Now, an embodiment of the present invention will be described below by referring to the drawings. A battery capacity controller of the embodiment described below is mounted on a vehicle such as an EV (Electric Vehicle) or an HEV (Hybrid Electrical Vehicle) provided with an electric motor driven by an electric power supplied from a battery as a driving source.

FIG. 1 is a block diagram showing an inner structure of the vehicle including the battery capacity controller of one embodiment according to the present invention. The vehicle shown in FIG. 1 mainly includes an internal combustion engine E, an electric motor M, a transmission T, driving wheels W, an electric motor driving part 101, a battery 103, a current detecting part 105, a voltage detecting part 107, a temperature detecting part 109, a residual capacity estimating part 111, a command part 113, a rotating speed sensor 115, a traveling state detecting part 117, a storing part 119 and a control part 121.

The vehicle shown in FIG. 1 is a parallel type hybrid vehicle having a structure in which the internal combustion engine E, the electric motor M and the transmission T are connected in series. In the hybrid vehicle of this type, the driving forces of both the internal combustion engine E and the electric motor M are transmitted to the driving wheels W through the transmission T. Further, at the time of deceleration of the hybrid vehicle, when the driving force is transmitted to the electric motor M side from the driving wheel W side, the electric motor M functions as a power generator to generate what is called a regenerative braking force and recover a kinetic energy of a vehicle body as an electric energy. Further, in accordance with the driving state of the vehicle, the electric motor M is driven as the power generator by the output of the internal combustion engine E to generate a power generating energy.

The driving and regenerative operations of the electric motor M is carried out by the electric motor driving part that receives a control command from the control part 121. To the electric motor driving part 101, is connected the battery 103 that stores the power generating energy and the regenerative energy outputted from the electric motor M and supplies the electric energy to the electric motor M.

Figure 2:
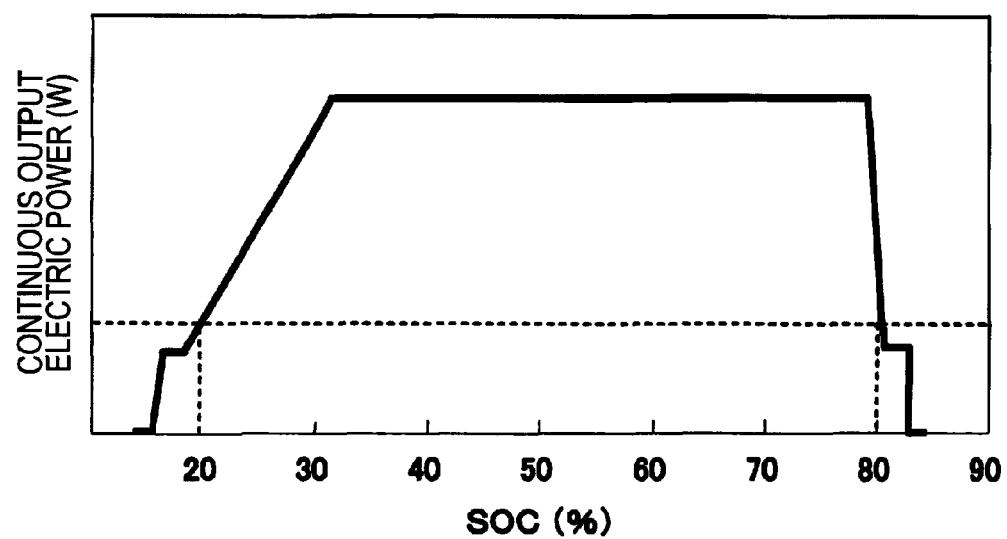
FIG. 2 is a graph showing a continuous output voltage relative to a residual capacity (SOC: State of Charge) of a battery.

The battery 103 includes, for instance, an Ni-MH (nickel-metal hydride) battery using metal hydride as a cathode active material or a lithium ion battery, an electric double layer capacitor, a condenser or the like. FIG. 2 is a graph showing a continuous output voltage relative to a residual capacity (SOC: State of Charge) of the battery 103. As shown in FIG. 2, the battery can supply the continuous output voltage of a prescribed level or higher to a load such as the electric motor M when the SOC is located within a prescribed range (20% to 80%). In a below-described explanation, a lower end value (20%) of a prescribed width of the SOC is referred to as a "lower limit SOC" and an upper end value (80%) is referred to as an "upper limit SOC". The charging and discharging operations are of the battery 103 are repeated between the upper limit SOC and the lower limit SOC. In this case, the internal resistance of the battery 103 obtained when the SOC is located in the vicinity of the lower limit SOC is increased in accordance with the decrease of the SOC. Further, the internal resistance of the battery 103 obtained when the SOC is located in the vicinity of the upper SOC is increased in accordance with the increase of the SOC.

The current detecting part 105 detects the charging and discharging current I of the battery 103. The charging and discharging current I includes a discharging current supplied to the load such as the electric motor M from the battery 103 and a charging current supplied to the battery 103 from the electric motor M that carries out the regenerative operation or a power generating operation. The voltage detecting part 107 detects the terminal voltage V of the battery 103. The temperature detecting part 109 detects the temperature T of the battery 103.

The residual capacity estimating part 111 integrates the charging and discharging current I detected by the current detecting part 105 at intervals of prescribed periods to calculate a quantity of integrated charging current and a quantity of integrated discharging current and adds or subtracts the quantity of integrated charging current and the quantity of integrated discharging current to or from the SOC of an initial state or the SOC immediately before the start of charging and discharging operations to estimate the SOC of the battery 103. The SOC estimated by the residual capacity estimating part 111 is referred to as an "integrated SOC", hereinafter. When the residual capacity estimating part 111 estimates the integrated SOC, the residual capacity estimating part 111 may multiply the quantity of integrated charging current and the quantity of integrated discharging current by a coefficient in accordance with the temperature T of the battery 103 detected by the temperature detecting part 109.

The command part 113 outputs a signal related to a stepping operation on an accelerator by a driver of the vehicle to the control part 121. The rotating speed sensor 115 detects the rotating speed of the electric motor M. The traveling state detecting part 117 estimates the traveling resistance of the vehicle on the basis of the rotating speed of the electric motor M or the driving wheels W, a vehicle speed, an acceleration, a degree of inclination measured by an inclinometer not shown in the drawing, etc. to detect the running state of the vehicle. A state of climbing a slope or a state of cruising travel, a state of traveling on the sands, a state of traveling on an icy road or the like of the vehicle is detected by the traveling state detecting part 117. For instance, when the traveling resistance is a prescribed value or higher, the traveling state detecting part 117 detects the state of climbing a slope of the vehicle.

The storing part 119 stores the terminal voltage of the battery 103 when the SOC of the battery 103 is the upper limit SOC and the terminal voltage of the battery 103 when the SOC of the battery 103 is the lower limit SOC. The terminal voltages at the time of the upper limit SOC and the lower limit SOC are respectively different depending on the charging and discharging current I of the battery 103 and the temperature T of the battery 103. Therefore, the storing part 119 stores a map on which are respectively shown the terminal voltages at the time of the upper limit SOC and the lower limit SOC corresponding to the different charging and discharging current I and the temperature T.

The control part 121 generates a current command that designates a supply current for generating a torque necessary for the electric motor M in accordance with the SOC of the battery 103, the signal inputted from the command part 113 and the rotating speed of the electric motor M detected by the rotating speed sensor 115 to output the current command to the electric motor driving part 101. The SOC of the battery recognized by the control part 121 is referred to as a "control SOC". The control part 121 ordinarily considers the integrated SOC estimated by the residual capacity estimating part 111 to be the control SOC. In this case, when prescribed conditions are satisfied, the control part 121 changes the integrated SOC estimated by the residual capacity estimating part 111 to a proper value. Now, the prescribed conditions and the correction of the integrated SOC will be described below in detail. A following explanation will be given to two cases at the time of a discharging operation and a charging operation of the battery 103.

<At the Time of Discharging Operation>

When an internal resistance difference as a difference between a present internal resistance value of the battery 103 and an internal resistance value of the battery at the time of the lower limit SOC is a prescribed value or lower, and the traveling state of the vehicle detected by the traveling state detecting part 117 is the state of climbing a slope, the control part 121 decides that the above-described prescribed conditions are satisfied. As described above, the internal resistance of the battery 103 is increased in accordance with the decrease of the SOC when the SOC is located in the vicinity of the lower limit SOC.

The above-described internal resistance difference RD can be expressed by a below-described equation (2). In this case, EOc designates a present open circuit voltage of the battery 103. EOh designates an open circuit voltage of the battery 103 at the time of the upper limit SOC. Vc designates a present terminal voltage of the battery 103. Vh designates a terminal voltage of the battery 103 at the time of the upper limit SOC. Ic designates a present charging current of the battery 103. The present terminal voltage Vc of the battery 103 is a voltage value detected by the voltage detecting part 107. Further, the present charging current Ic of the battery 103 is a current value detected by the current detecting part 105. The control part 121 reads from the storing part 119 the terminal voltage Vh of the battery 103 at the time of the upper limit SOC corresponding to the charging current Ic and the temperature T of the battery 103 detected by the temperature detecting part 109.

Internal resistance difference (1)

$$RD \ (= \text{internal resistance value at the time of lower limit } SOC - \text{present internal resistance value}) =$$
$$(EO1 - V1)/Id - (EOc - Vc)/Id =$$
$$\{(EO1 - EOc) - (V1 - Vc)\}/Id \approx (Vc - V1)/Id$$

In the above-described equation (1), when the SOC of the battery comes near to the lower limit SOC, since the open circuit voltage EOl of the battery 103 at the time of the lower limit SOC and the present open circuit voltage EOc of the battery 103 have substantially the same value (EOl=EOc), EOl−EOc is considered to be 0.

Accordingly, when a value obtained by dividing the difference between the present terminal voltage Vc of the battery 103 and the terminal voltage Vl of the battery 103 at the time of the lower limit SOC by the discharging current Id is a prescribed value or lower and the vehicle is in a slope climbing state, the control part 121 decides that the above-described prescribed conditions are satisfied.

Figure 3:
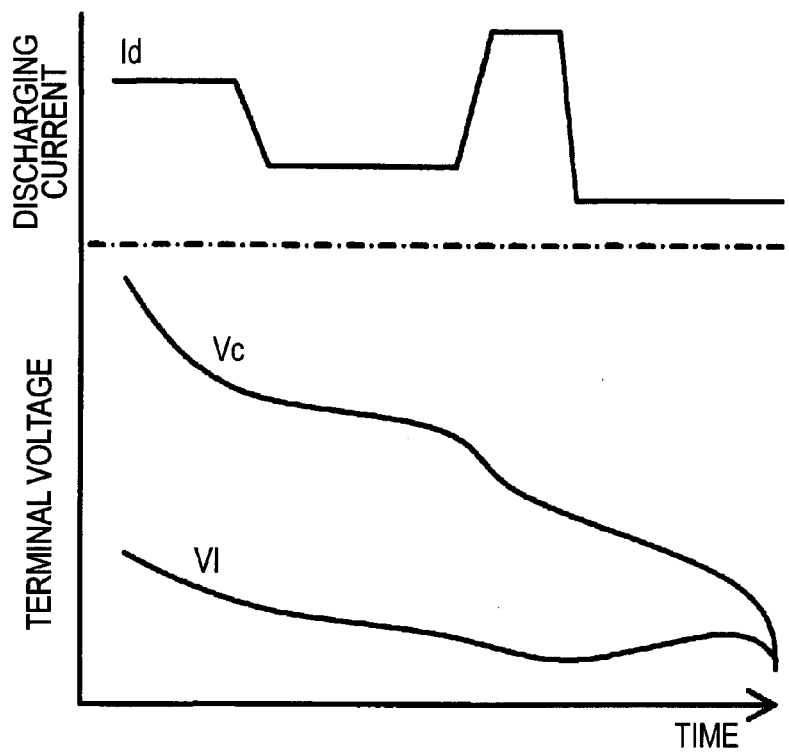
FIG. 3 is a graph showing one example of transitions of a present terminal voltage Vc of the battery, a terminal voltage Vl of the battery at the time of a lower limit SOC and a discharging current Id.
Figure 4:
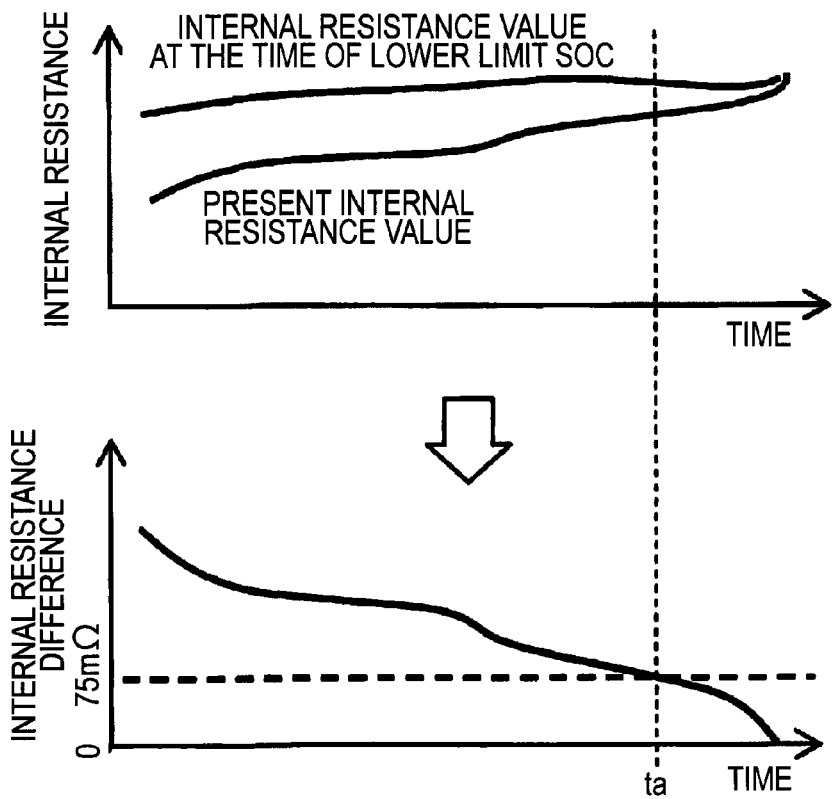
FIG. 4 is a graph showing one example of transitions of a present internal resistance value of the battery, an internal resistance value of the battery at the time of the lower limit SOC and an internal resistance difference.

FIG. 3 is a graph showing one example of a transition of the present terminal voltage Vc of the battery 103, the terminal voltage Vl of the battery 103 at the time of the lower limit SOC and the discharging current Id. Further, FIG. 4 shows graphs illustrating one example of transitions of the present internal resistance value of the battery 103, the internal resistance value of the battery 103 at the time of the lower limit SOC and the internal resistance difference. As shown in FIG. 3, when the present terminal voltage Vc of the battery 103 comes nearer to the terminal voltage Vl of the battery 103 at the time of the lower limit SOC, the present internal resistance value is more increased and the internal resistance difference comes nearer to 0, as shown in FIG. 4. When the internal resistance difference is 0, the SOC of battery is the lower limit SOC. However, in this embodiment, as shown in FIG. 4, when the internal resistance difference is the prescribed value or lower (75 mΩ or lower)(t=ta), the integrated SOC estimated by the residual capacity estimating part 111 is changed to the proper value in the lower limit side.

Figure 5:
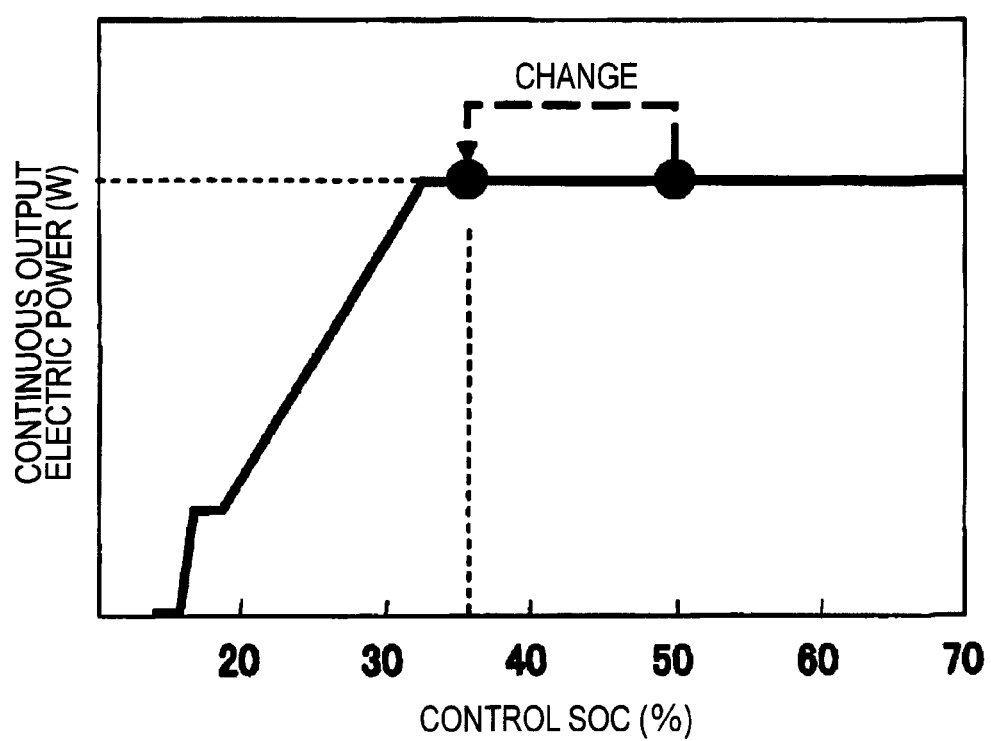
FIG. 5 is a diagram showing a relation between the correction of a control SOC to a lower limit side and a continuous output voltage.

In this embodiment, before the internal resistance difference is 0, the integrated SOC is changed to the proper value in the lower limit side. Namely, as shown in the graph of FIG. 2, when the SOC of the battery 103 is located in a range of about 35% to about 80%, the continuous output voltage can be supplied. Thus, in this embodiment, when the internal resistance difference is the prescribed value or lower (75 mΩ or lower) (t=ta), the integrated SOC estimated by the residual capacity estimating part 111 is changed to 35% as the proper value in the lower limit side. The proper value (35%) at this time is set so that the same continuous output voltage as that before the integrated SOC is corrected can be supplied, as shown in FIG. 5.

Figure 6:
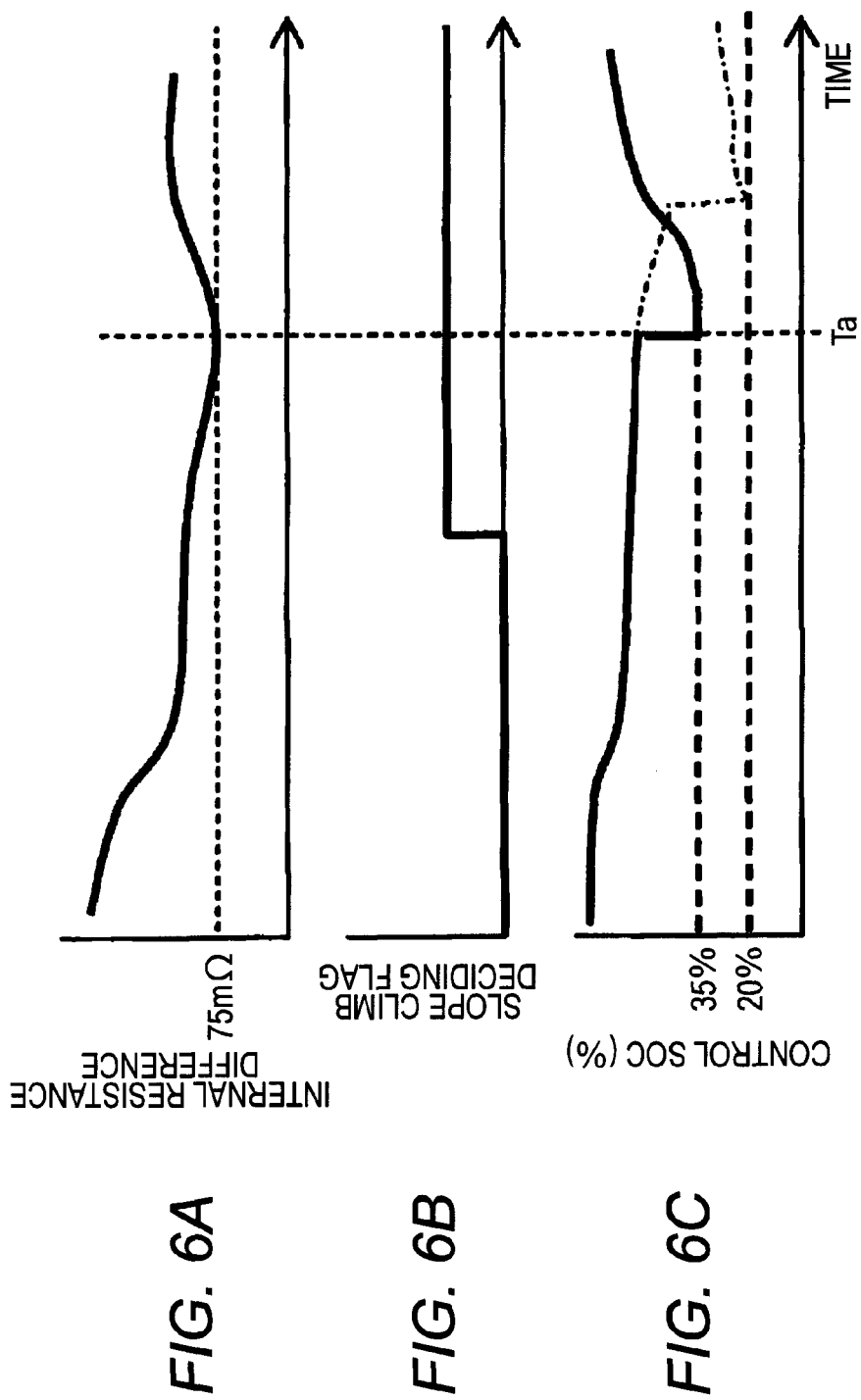
FIGS. 6A to 6C are graphs showing transitions of the internal resistance difference (FIG. 6A), a slope climb deciding flag (FIG. 6B) and the control SOC (FIG. 6C) obtained when, since the internal resistance difference reaches a prescribed value during the discharging operation of the battery due to a slope climbing operation of the vehicle.

The control part 121 controls the battery 103 to be charged from an early stage before the internal resistance difference reaches zero by changing the integrated SOC to the proper value in the lower limit side. FIGS. 6A to 6C show graphs illustrating transitions of the internal resistance difference (FIG. 6A), a slope climb deciding flag (FIG. 6B) and the control SOC (FIG. 6C) obtained when, since the internal resistance difference reaches the prescribed value during the discharging operation of the battery 103 due to the slope climbing operation of the vehicle, the integrated SOC (the control SOC) is lowered to the proper value in the lower limit side, and then, the battery 103 is charged. A dashed line shown in FIG. 6C shows a transition of the control SOC in a usual case. As shown by the dashed line, usually, the control SOC is abruptly lowered to the lower limit SOC, and then, a charging operation is started. However, after the control SOC is lowered to the lower limit SOC, the battery 103 may not possibly supply sufficiently the continuous output electric power to the electric motor M for a while. On the other hand, in this embodiment, the control SOC is corrected before the control SOC falls to the lower limit SOC to start the charging operation of the battery 103. Therefore, even when the control SOC is corrected under a state that the vehicle climbs a slope, the battery 103 can continuously supply the continuous output voltage to the electric motor M. As a result, the electric motor M can continuously output a desired torque.

<At the Time of Charging Operation>

When an internal resistance difference as a difference between a present internal resistance value of the battery 103 and an internal resistance value of the battery 103 at the time of the upper limit SOC is a prescribed value or lower, and the traveling state of the vehicle detected by the traveling state detecting part 117 is the state of cruising travel, the control part 121 decides that the above-described prescribed conditions are satisfied. As described above, the internal resistance of the battery 103 is increased in accordance with the increase of the SOC when the SOC is located in the vicinity of the upper limit SOC.

The above-described internal resistance difference RD can be expressed by a below-described equation (2). In this case, EOc designates a present open circuit voltage of the battery 103. EOh designates an open circuit voltage of the battery 103 at the time of the upper limit SOC. Vc designates a present terminal voltage of the battery 103. Vh designates a terminal voltage of the battery 103 at the time of the upper limit SOC. Ic designates a present charging current of the battery 103. The present terminal voltage Vc of the battery 103 is a voltage value detected by the voltage detecting part 107. Further, the present charging current Ic of the battery 103 is a current value detected by the current detecting part 105. The control part 121 reads from the storing part 119 the terminal voltage Vh of the battery 103 at the time of the upper limit SOC corresponding to the charging current Ic and the temperature T of the battery 103 detected by the temperature detecting part 109.

Internal resistance difference (2)

$$RD \ (= \text{internal resistance value at the time of upper limit } SOC -$$
$$\text{present internal resistance value}) =$$
$$(EOh - Vh)/Ic - (EOc - Vc)/Ic =$$
$$\{(EOh - EOc) - (Vh - Vc)\}/Ic \approx (Vc - Vh)/Ic$$

In the above-described equation (2), when the SOC of the battery comes near to the upper limit SOC, since the open circuit voltage EOh of the battery 103 at the time of the upper limit SOC and the present open circuit voltage EOc of the battery 103 have substantially the same value (EOh=EOc), EOh−EOc is considered to be 0.

Accordingly, when a value obtained by dividing the difference between the present terminal voltage Vc of the battery 103 and the terminal voltage Vh of the battery 103 at the time of the upper limit SOC by the charging current Ic is a prescribed value or lower and the vehicle is in a cruising travel state, the control part 121 decides that the above-described prescribed conditions are satisfied.

Figure 7:
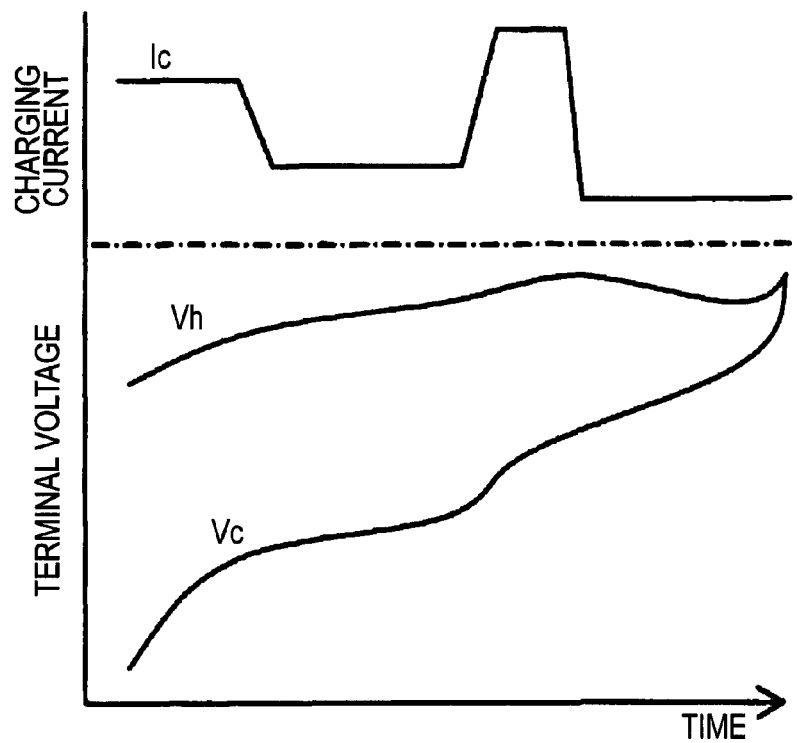
FIG. 7 is a graph showing one example of transitions of a present terminal voltage Vc of the battery, a terminal voltage Vh of the battery at the time of an upper limit SOC and a charging current Ic.
Figure 8:
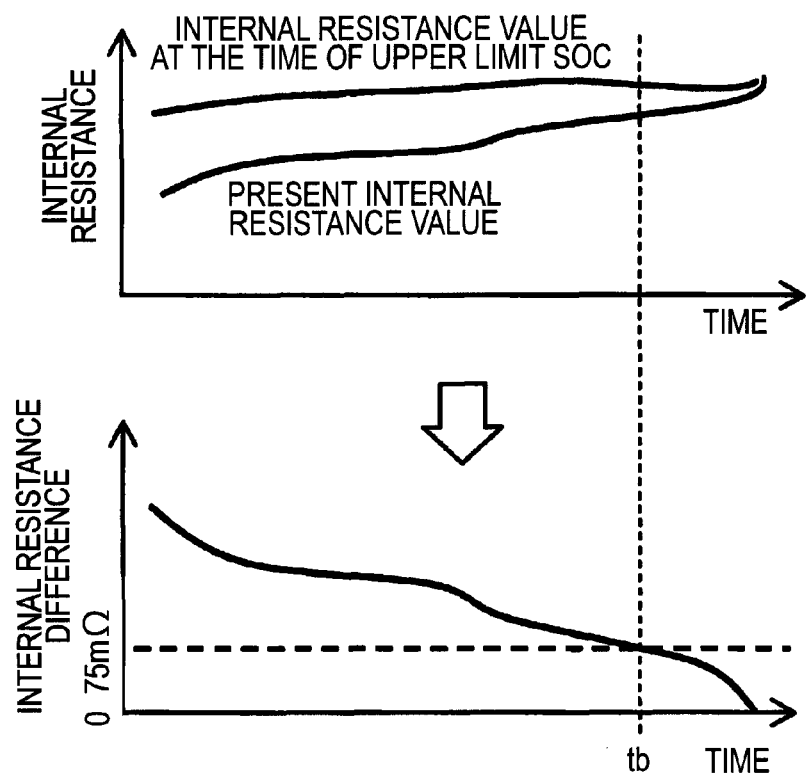
FIG. 8 is a graph showing one example of transitions of a present internal resistance value of the battery, an internal resistance value of the battery at the time of the upper limit SOC and an internal resistance difference.

FIG. 7 is a graph showing one example of a transition of the present terminal voltage Vc of the battery 103, the terminal voltage Vh of the battery 103 at the time of the upper limit SOC and the charging current Ic. Further, FIG. 8 shows graphs illustrating one example of transitions of the present internal resistance value of the battery 103, the internal resistance value of the battery 103 at the time of the upper limit SOC and the internal resistance difference. As shown in FIG. 7, when the present terminal voltage Vc of the battery 103 comes nearer to the terminal voltage Vh of the battery 103 at the time of the upper limit SOC, the present internal resistance value is more increased and the internal resistance difference comes nearer to 0, as shown in FIG. 8. When the internal resistance difference is 0, the SOC of battery is the lower limit SOC. However, in this embodiment, as shown in FIG. 8, when the internal resistance difference is the prescribed value or lower (for instance, 75 mΩ or lower) (t=tb), the integrated SOC estimated by the residual capacity estimating part 111 is changed to the proper value in the upper limit side.

Figure 9:
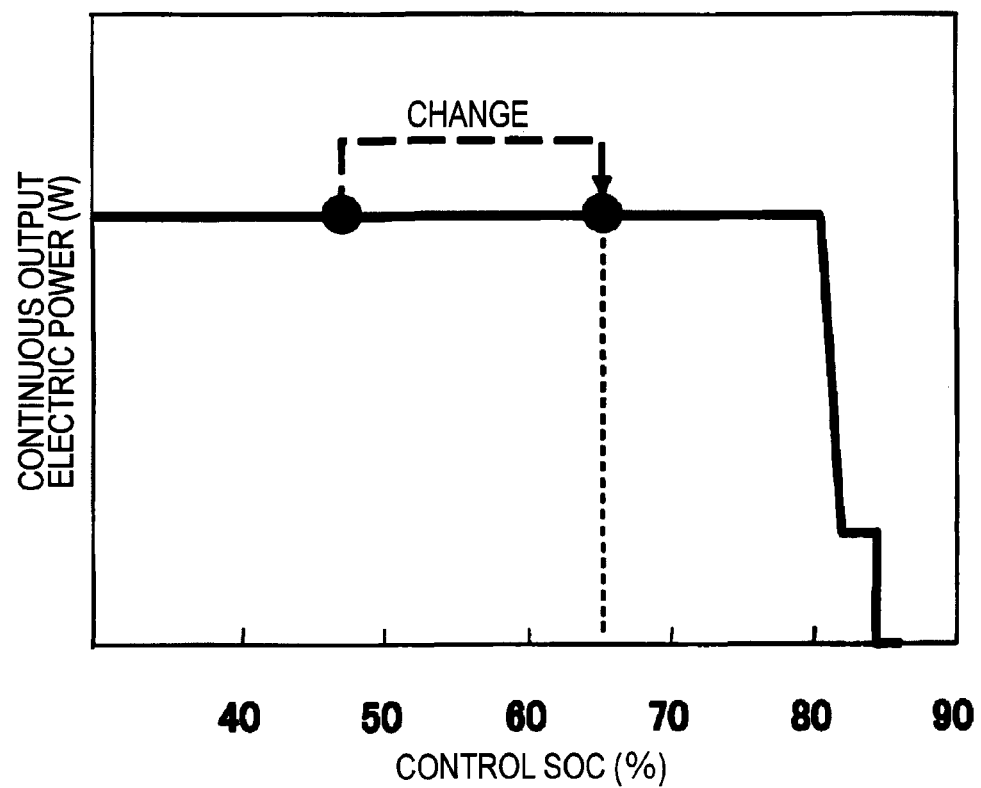
FIG. 9 is a diagram showing a relation between the correction of a control SOC to an upper limit side and a continuous output voltage.

In this embodiment, before the internal resistance difference is 0, the integrated SOC is changed to the proper value in the upper limit side. Namely, as shown in the graph of FIG. 2, when the SOC of the battery 103 is located in a range of about 35% to about 80%, the continuous output voltage can be supplied. Thus, in this embodiment, when the internal resistance difference is the prescribed value or lower (for instance 75 m106 or lower) (t 32 tb), the integrated SOC estimated by the residual capacity estimating part 111 is changed to 65%, as the proper value in the upper limit side. The proper value at this time is set so that the same continuous output voltage as that before the integrated SOC is corrected can be supplied, as shown in FIG. 9.

Figure 10:
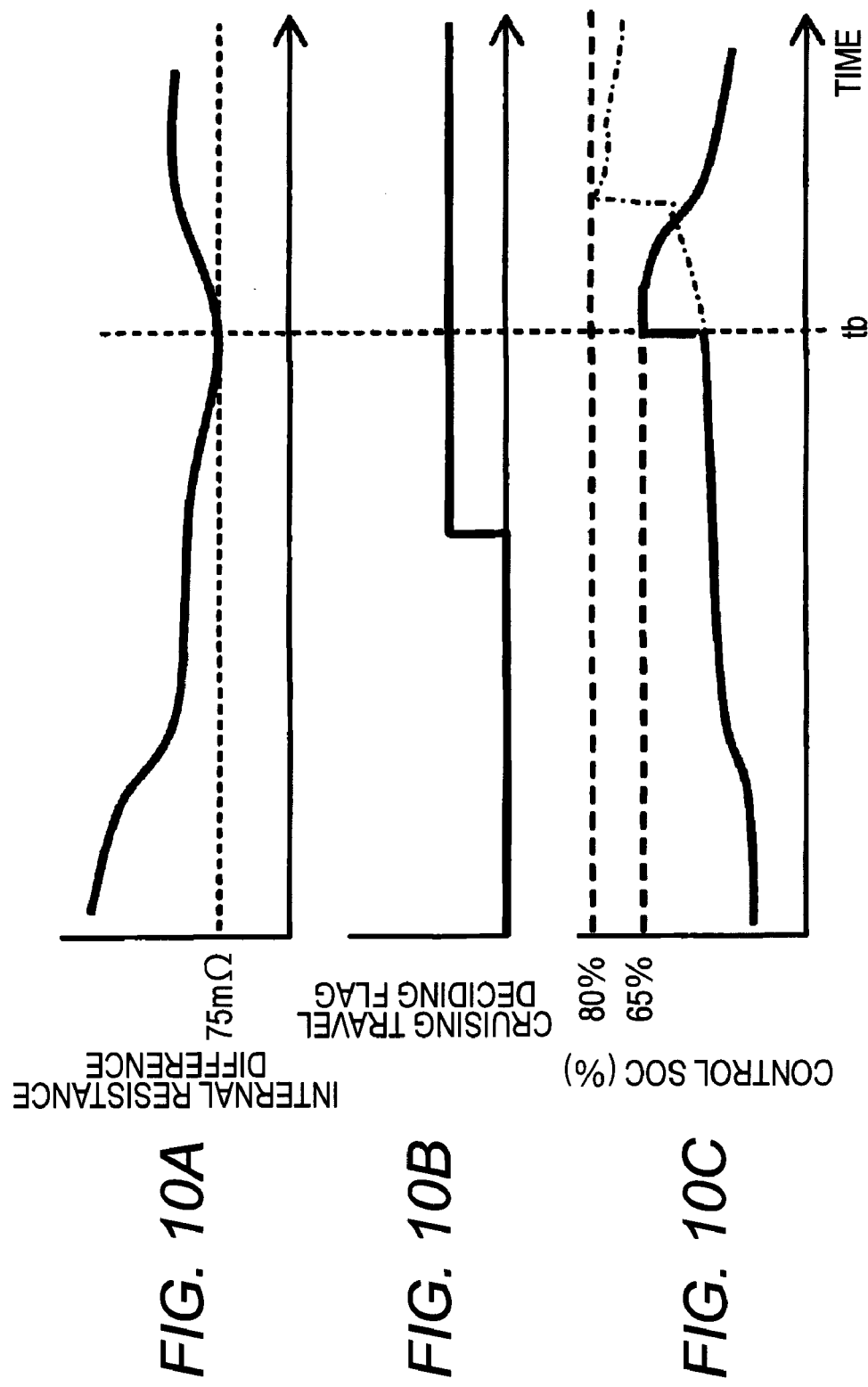
FIGS. 10A to 10C are graphs showing transitions of the internal resistance difference (FIG. 10A), a cruising travel deciding flag (FIG. 10B) and the control SOC (FIG. 10C) obtained when, since the internal resistance difference reaches a prescribed value during the charging operation of the battery due to a cruising travel of the vehicle.
Figure 11:
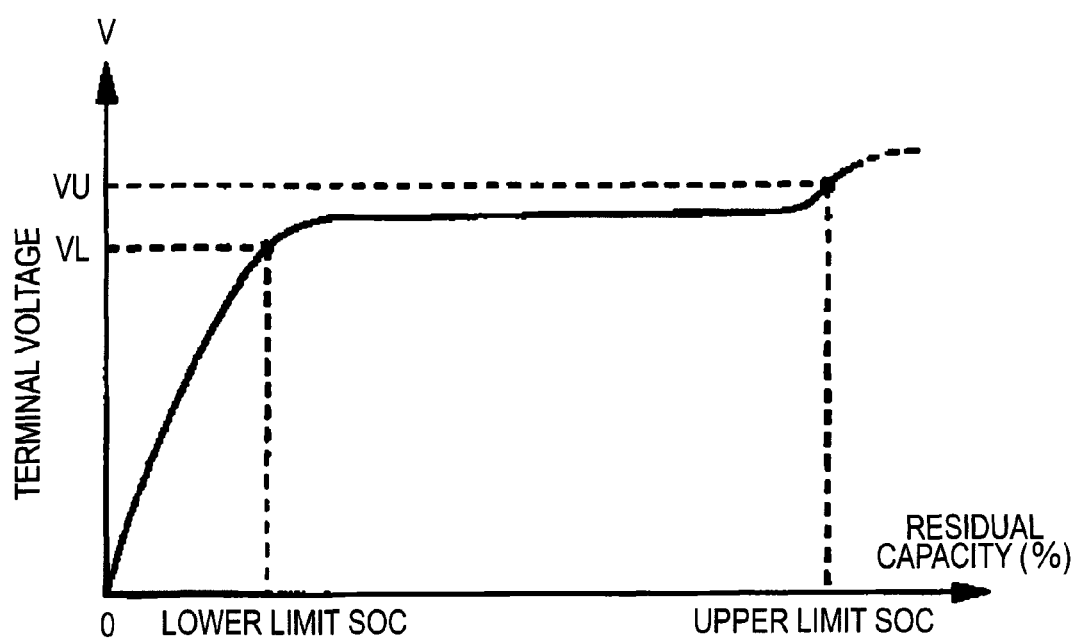
FIG. 11 is a graph showing a relation between an SOC and an open circuit voltage (OCV) of a battery cell.
Figure 12B:
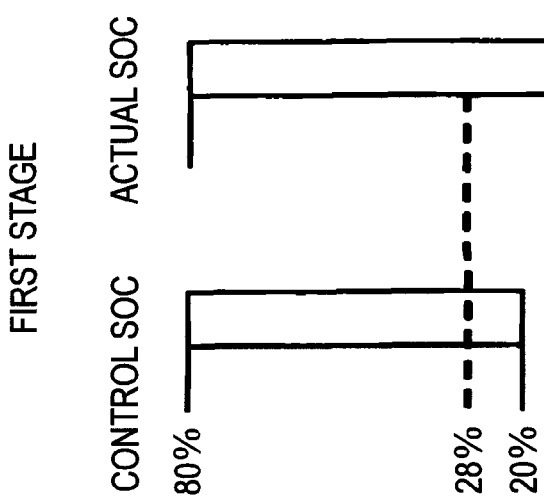
FIGS. 12A and 12B are diagrams showing ranges of a control SOC and an actual SOC of a battery in a first stage (FIG. 12A) and the last stage (FIG. 12B).
Figure 12A:
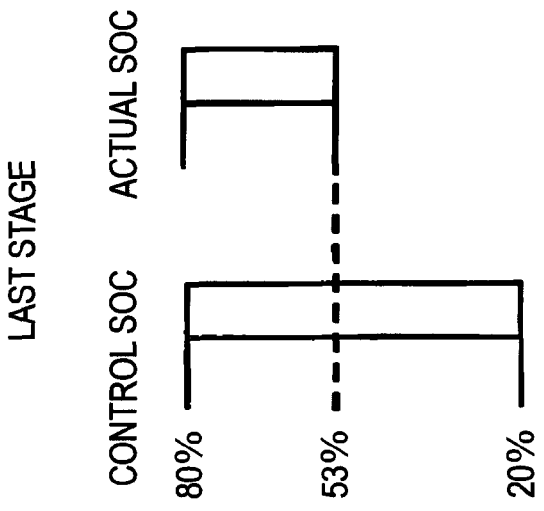
Figure 13B:
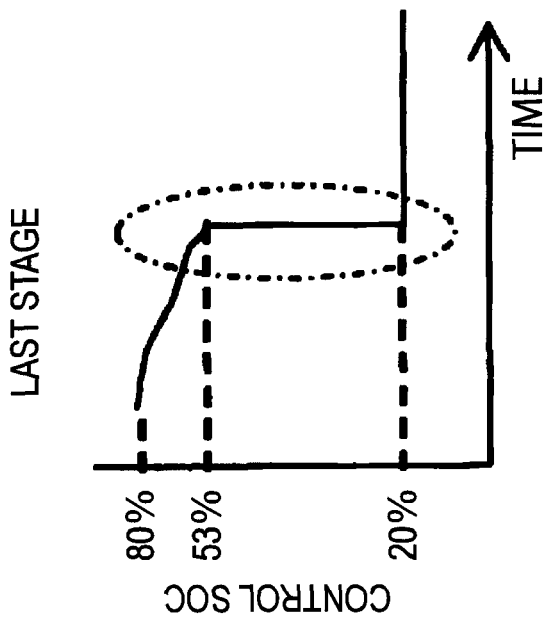
FIGS. 13A and 13B are diagrams showing transitions of a decreasing control SOC of the battery in a first stage (FIG. 13A) and the last stage (FIG. 13B).
Figure 13A:
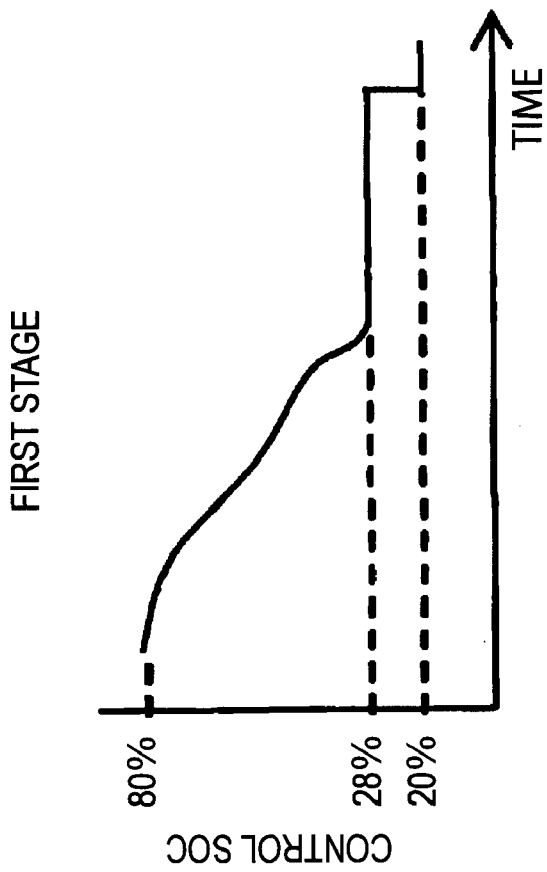
Figure 14:
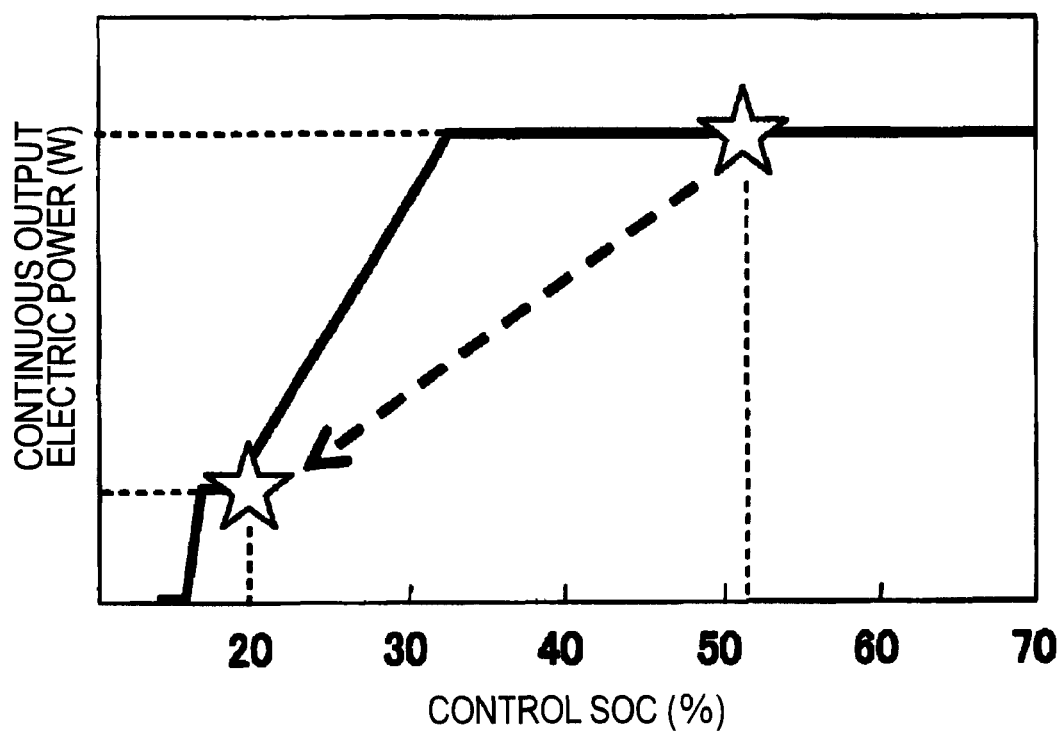
FIG. 14 is a diagram showing an output change of the battery that is changed by the control of the decreasing control SOC of the battery in the last stage.
Figure 15A:
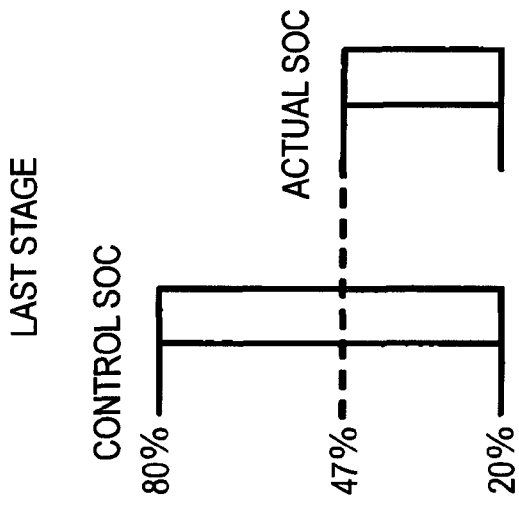
FIGS. 15A and 15B are diagrams showing ranges of a control SOC and an actual SOC of a battery in a first stage (FIG. 15A) and the last stage (FIG. 15B).
Figure 15B:
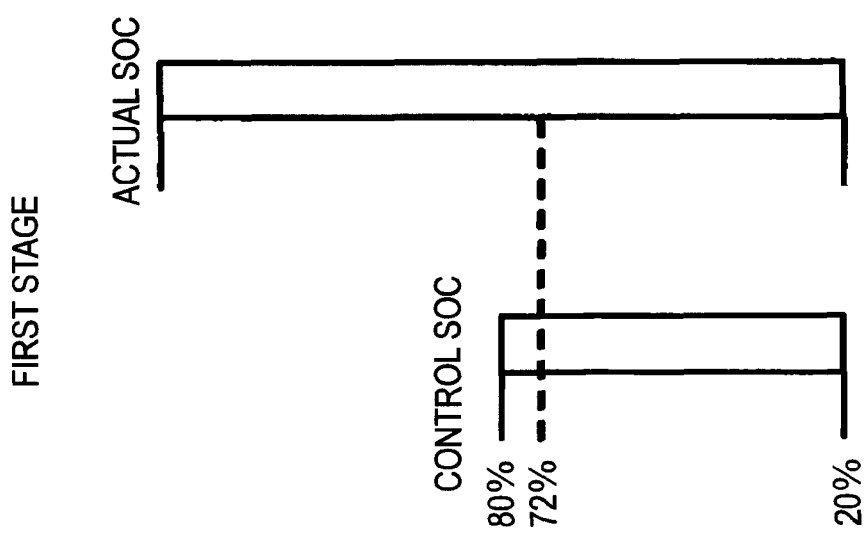
Figure 16A:
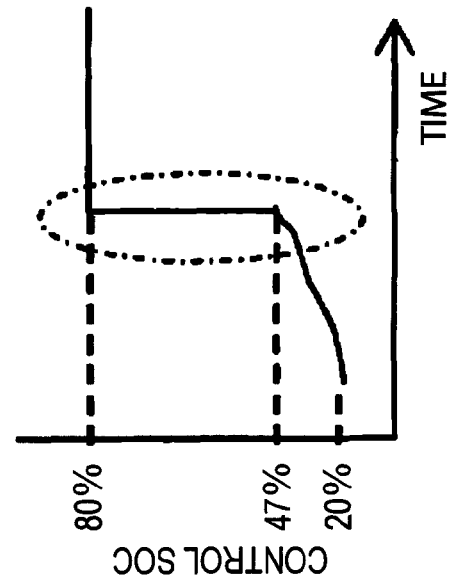
FIGS. 16A and 16B are diagrams showing transitions of an increasing control SOC of the battery in a first stage (FIG. 16A) and the last stage (FIG. 16B).
Figure 16B:
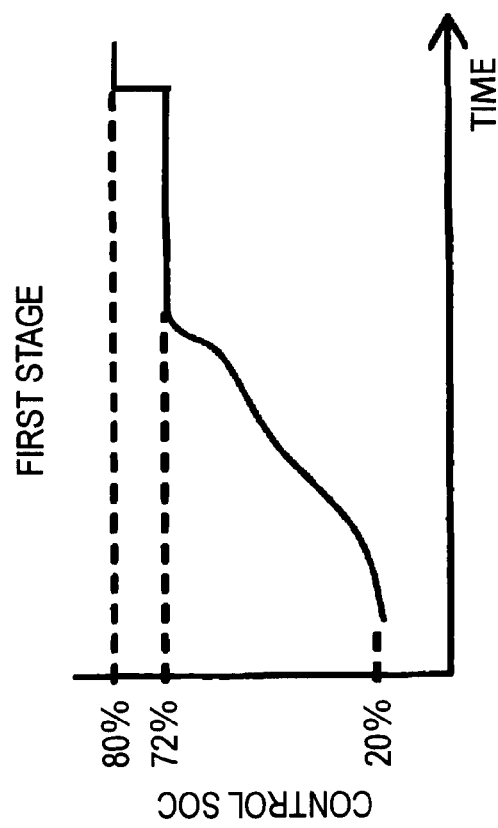
Figure 17:
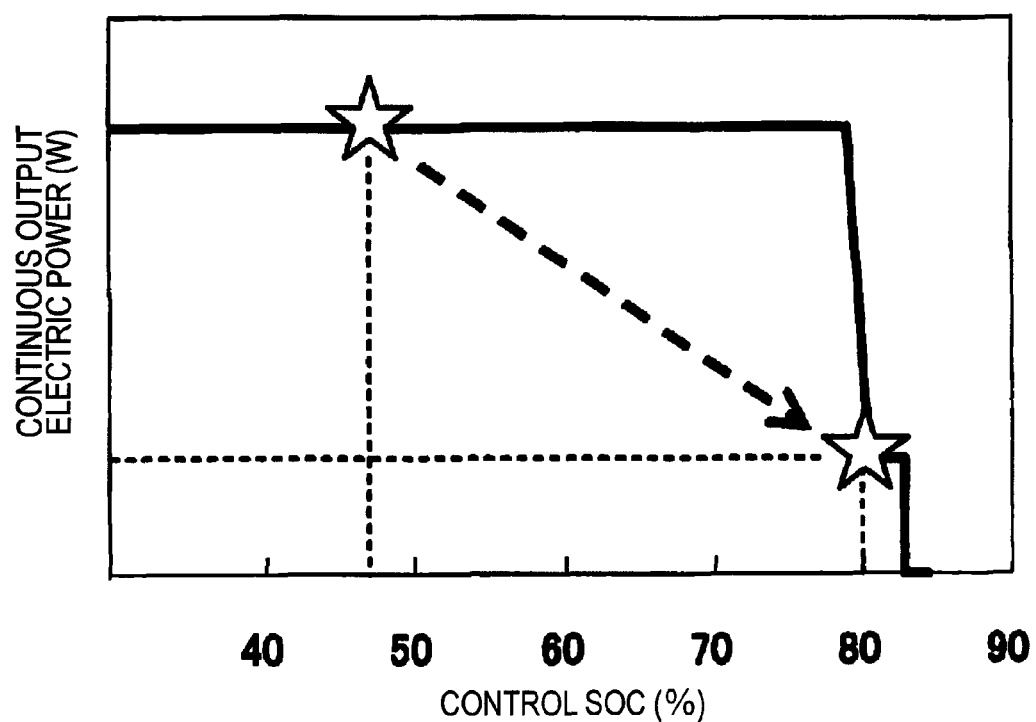
FIG. 17 is a diagram showing an output change of the battery that is changed by the control of the increasing control SOC of the battery in the last stage.

The control part 121 controls the battery 103 to be discharged from an early stage before the internal resistance difference reaches zero by changing the integrated SOC to the proper value in the upper limit side. FIGS. 10A to 10C show graphs illustrating transitions of the internal resistance difference (FIG. 10A), a cruising travel deciding flag (FIG. 10B) and the control SOC (FIG. 10C) obtained when, since the internal resistance difference reaches the prescribed value during the charging operation of the battery 103 due to the cruising travel of the vehicle, the integrated SOC (the control SOC) is raised to the proper value in the upper limit side, and then, the battery 103 is discharged. A dashed line shown in FIG. 10C shows a transition of the control SOC in a usual case. As shown by the dashed line, usually, the control SOC is abruptly increased to the upper limit SOC, and then, a discharging operation is started. On the other hand, in this embodiment, the control SOC is corrected before the control SOC is increased to the upper limit SOC to start the discharging operation of the battery 103. Therefore, a possibility that the battery 103 is overcharged can be decreased.

According to the above-described correction of the control SOC based on the internal resistance difference during the discharging operation or the charging operation, the SOC of the battery 103 can be highly accurately detected and the driver of the vehicle does not have an uneasy feeling for a traveling performance even when the control SOC is corrected at the time of climbing a slope or cruising travel by the vehicle. Further, since the charging and discharging operations are carried out before the actual SOC of the battery 103 reaches the upper limit SOC or the lower limit SOC, there is a low possibility that an adverse effect is applied to the durability of the battery 103.

The above-described correction of the control SOC may be carried out only when the charging and discharging currents have prescribed values or lower. Further, the charging and discharging operations carried out after the control SOC is corrected may be more rapidly carried out than ordinary charging and discharging operations.

What is claimed is:

1. A battery capacity controller comprising:
a battery capacity estimating part that estimates a battery capacity of a battery in which an internal resistance is increased in accordance with a decrease of the battery capacity in the vicinity of a threshold lower limit battery capacity; and
a battery capacity correcting part calculates a present internal resistance value and an internal resistance value of the battery which is at the time of the lower limit battery capacity, calculates an internal resistance difference between the present internal resistance value and the internal resistance value of the battery which is at the time of the lower limit battery capacity, and compares the calculated internal resistance difference with a threshold value, wherein
the battery capacity correcting part changes, during the discharge of the battery, the estimated battery capacity to a proper value which is lower than the estimated battery capacity, when an internal resistance difference between the present internal resistance value of the battery and the internal resistance value of the battery which is at the time of the lower limit battery capacity is less than or equal to the threshold value.

2. The battery capacity controller defined in claim 1, further comprising:
a current detecting part that detects a charging and discharging current of the battery;
a voltage detecting part that detects a terminal voltage of the battery; and
a storing part that stores the terminal voltage when the battery capacity of the battery is the lower limit battery capacity, wherein
the battery capacity correcting part divides a difference between the terminal voltage of the battery detected by the voltage detecting part and the terminal voltage of the battery during the lower limit battery capacity by the value of a discharging current of the battery detected by the current detecting part to calculate the internal resistance difference.

3. The battery capacity controller defined in claim 1, further comprising:
a charging and discharging control part that controls the charging and discharging operations of the battery in accordance with the estimated battery capacity, wherein
the charging and discharging control part starts the charging operation of the battery, when the battery capacity correcting part changes the estimated battery capacity to the proper value in the lower limit side.

4. The battery capacity controller defined in claim 1, wherein
the proper value in the lower limit side is a value lower than the estimated battery capacity, and
a battery capacity value that can output the same continuous output electric power as a continuous output electric power of the battery corresponding to the estimated battery capacity when the internal resistance difference is the threshold value.

5. A battery capacity controller comprising:
a battery capacity estimating part that estimates the battery capacity of a battery in which an internal resistance is increased in accordance with the increase of the battery capacity in the vicinity of a threshold upper limit battery capacity; and
a battery capacity correcting part calculates a present internal resistance value and an internal resistance value of the battery which is at the time of the upper limit battery capacity, calculates an internal resistance difference between the present internal resistance value and the internal resistance value of the battery which is at the time of the upper limit battery capacity, and compares the calculated internal resistance difference with a threshold value, wherein
the battery capacity correcting part changes, during the charging of the battery, the estimated battery capacity to a proper value which is lower than the estimated battery capacity, when the internal resistance difference between present internal resistance value of the battery and the internal resistance value of the battery which is at the time of the upper limit battery capacity is less than or equal to the threshold value.

6. The battery capacity controller defined in claim 5, further comprising:
a current detecting part that detects a charging and discharging current of the battery;
a voltage detecting part that detects the terminal voltage of the battery; and
a storing part that stores the terminal voltage when the battery capacity of the battery is the upper limit battery capacity, wherein
the battery capacity correcting part divides a difference between the terminal voltage of the battery detected by the voltage detecting part and the terminal voltage of the battery during the upper limit battery capacity by the value of the charging current of the battery detected by the current detecting part to calculate the internal resistance difference.

7. The battery capacity controller defined in claim 5, further comprising:
a charging and discharging control part that controls the charging and discharging operations of the battery in accordance with the estimated battery capacity, wherein
the charging and discharging control part starts the discharging operation of the battery, when the battery capacity correcting part changes the estimated battery capacity to the proper value in the upper limit side.

8. The battery capacity controller defined in claim 5, wherein
the proper value in the upper limit side is a value higher than the estimated battery capacity, and
a battery capacity value that can output the same continuous output electric power as a continuous output electric power of the battery corresponding to the estimated battery capacity when the internal resistance difference is the threshold value.

9. The battery capacity controller defined in claim 1, wherein
the battery provided in a vehicle on which an electric motor is mounted as a driving source supplies an electric power to the electric motor,
the battery capacity controller includes a traveling resistance estimating part that estimates the traveling resistance of the vehicle, and
the battery capacity correcting part operates when the traveling resistance estimated by the traveling resistance estimating part is a threshold value or higher.

10. The battery capacity controller defined in claim 1, wherein
the battery provided in the vehicle on which the electric motor is mounted as the driving source supplies the electric power to the electric motor, and
the battery capacity correcting part operates when the vehicle travels to climb a slope.

11. The battery capacity controller defined in claim 5, wherein
the battery provided in the vehicle on which the electric motor is mounted as the driving source supplies the electric power to the electric motor, and
the battery capacity correcting part operates when the vehicle travels to cruise.

12. The battery capacity controller defined in claim 1, wherein
the battery capacity correcting part operates when the charging and discharging current of the battery is located within a range of a threshold value.

13. The battery capacity controller defined in claim 1, wherein
the battery capacity estimating part estimates the battery capacity of the battery on the basis of the integration of the charging and discharging current of the battery.

14. The battery capacity controller defined in claim 5, wherein
the battery provided in a vehicle on which an electric motor is mounted as a driving source supplies an electric power to the electric motor,
the battery capacity controller includes a traveling resistance estimating part that estimates the traveling resistance of the vehicle, and
the battery capacity correcting part operates when the traveling resistance estimated by the traveling resistance estimating part is a threshold value or higher.

15. The battery capacity controller defined in claim 5, wherein
the battery capacity correcting part operates when the charging and discharging current of the battery is located within a range of a threshold value.

16. The battery capacity controller defined in claim 5, wherein
the battery capacity estimating part estimates the battery capacity of the battery on the basis of the integration of the charging and discharging current of the battery.

* * * * *